(12) United States Patent
    Takenouchi

(10) Patent No.: US 9,349,647 B2
(45) Date of Patent: May 24, 2016

(54) CUTTING METHOD

(71) Applicant: DISCO CORPORATION, Tokyo (JP)

(72) Inventor: Kenji Takenouchi, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/659,031

(22) Filed: Mar. 16, 2015

(65) Prior Publication Data

US 2015/0262881 A1    Sep. 17, 2015

(30) Foreign Application Priority Data

Mar. 17, 2014  (JP) ................... 2014-053195

(51) Int. Cl.
*H01L 21/78*  (2006.01)

(52) U.S. Cl.
CPC ...................... *H01L 21/78* (2013.01)

(58) Field of Classification Search
CPC ........................................... H01L 21/78
USPC .................................. 438/460, 464
See application file for complete search history.

(56) References Cited

U.S. PATENT DOCUMENTS

| 6,310,017 | B1* | 10/2001 | Grant | C11D 3/3947 134/2 |
| 2006/0040838 | A1* | 2/2006 | Shimada | C11D 3/042 510/175 |
| 2013/0203237 | A1* | 8/2013 | Yamaguchi | H01L 21/306 438/460 |

FOREIGN PATENT DOCUMENTS

| JP | 2001-077055 | 3/2001 |
| JP | 2001334494 | * 12/2001 |
| JP | 2004-259936 | 9/2004 |
| JP | 2007-125667 | 5/2007 |

* cited by examiner

*Primary Examiner* — Caleen Sullivan
(74) *Attorney, Agent, or Firm* — Greer Burns & Crain Ltd.

(57) ABSTRACT

A cutting method for cutting by a cutting blade a workpiece which includes metal at least in a predetermined cutting position. The cutting method includes a cutting step of cutting by the cutting blade the predetermined cutting position of the workpiece while supplying a cutting fluid, containing an organic acid and an oxidizing agent, to a processing point at which the cutting blade cuts into the workpiece.

3 Claims, 3 Drawing Sheets

CUTTING METHOD

BACKGROUND OF THE INVENTION

1. Field of the Invention

The present invention relates to a cutting method suitable for cutting a QFN substrate, a wafer having TEG formed on predetermined division lines, or the like.

2. Description of the Related Art

In recent years, there has been a demand for more weight reductions and miniaturization in regard of such electrical apparatuses as cell phones and personal computers. As a device suited to the miniaturization, a technology called chip size package (CSP) has been developed and put to practical use in which a semiconductor chip is packaged to form a device. CSPs are formed, for example, by dividing a quad flat non-lead package (QFN) substrate into individual devices. A QFN substrate includes a plurality of semiconductor chips arranged at predetermined intervals, an electrode frame formed in a grid pattern so as to partition the semiconductor chips, electrode terminals arranged to extend like fishbone inward from the electrode frame and connected to a bonding pad formed on the surface of each semiconductor chip, and a resin layer molded so as to envelope each semiconductor chip and the electrode frame.

In order to divide the QFN substrate into the individual CSPs, the electrode frame of the QFN substrate is cut by a cutting apparatus having a rotatable cutting blade, and the fishbone-like electrode terminals are separated on the basis of each individual device, to form the CSPs (see, for example, Japanese Patent Laid-Open No. 2004-259936). On the other hand, a plurality of characteristic evaluation metal elements which are made of, for example, copper and are called test element group (TEG) are formed on the predetermined division lines (streets) of the semiconductor wafer, for evaluation of electrical characteristics of the semiconductor devices. With the plurality of characteristic evaluation metal elements formed on the predetermined division lines, the TEG can be cut and removed at the time of dicing the semiconductor wafer.

When a workpiece which includes metal (that is a ductile material) at a predetermined cutting position, such as a QFN substrate or a semiconductor wafer having TEG formed on predetermined division lines, is cut by a cutting blade, burrs would be generated at the metal parts. The burrs thus generated may cause short-circuit between terminals. Alternatively, during handling of the workpiece, dropping of burrs on the bonding pads or the like occurs, to cause bonding failure. In order to overcome such problems, a variety of methods have been proposed. Examples of the methods include a reciprocative cutting method for coping with the burr problem, as disclosed in Japanese Patent Laid-Open No. 2001-77055, and a method in which a burr-removing nozzle is provided to remove the burrs generated, as disclosed in Japanese Patent Laid-Open No. 2007-125667.

SUMMARY OF THE INVENTION

As aforementioned, a variety of methods have been proposed for removing metallic burrs generated upon cutting. By the conventional methods, however, it is very difficult to completely remove the metallic burrs generated upon cutting.

Accordingly, it is an object of the present invention to provide a cutting method which makes it possible to restrain the generation of burrs when cutting by a cutting blade a workpiece which includes metal, as ductile material, at least in a predetermined cutting position.

In accordance with an aspect of the present invention, there is provided a cutting method for cutting by a cutting blade a workpiece which includes metal at least in a predetermined cutting position, the cutting method including a cutting step of cutting by the cutting blade the predetermined cutting position of the workpiece while supplying a cutting fluid to a processing point at which the cutting blade cuts into the workpiece, the cutting fluid containing an organic acid and an oxidizing agent.

Preferably, the cutting fluid further contains an anticorrosive. Preferably, the cutting step is carried out with an ultrasonic vibration applied to the cutting blade in a radial direction of the cutting blade.

In the cutting method of the present invention, cutting is carried out while supplying the cutting fluid containing an organic acid and an oxidizing agent to the processing point. By the organic acid contained in the cutting fluid, the metal is modified to be lowered in ductility, resulting in that generation of burrs is restrained. Besides, with the oxidizing agent contained in the cutting fluid, the properties of the film formed on the metal surface are changed by the cutting fluid, so that the metal loses ductility, to become easily removable, whereby processability is enhanced.

Preferably, the cutting fluid contains an anticorrosive. This prevents corrosion (elution) of the metal.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
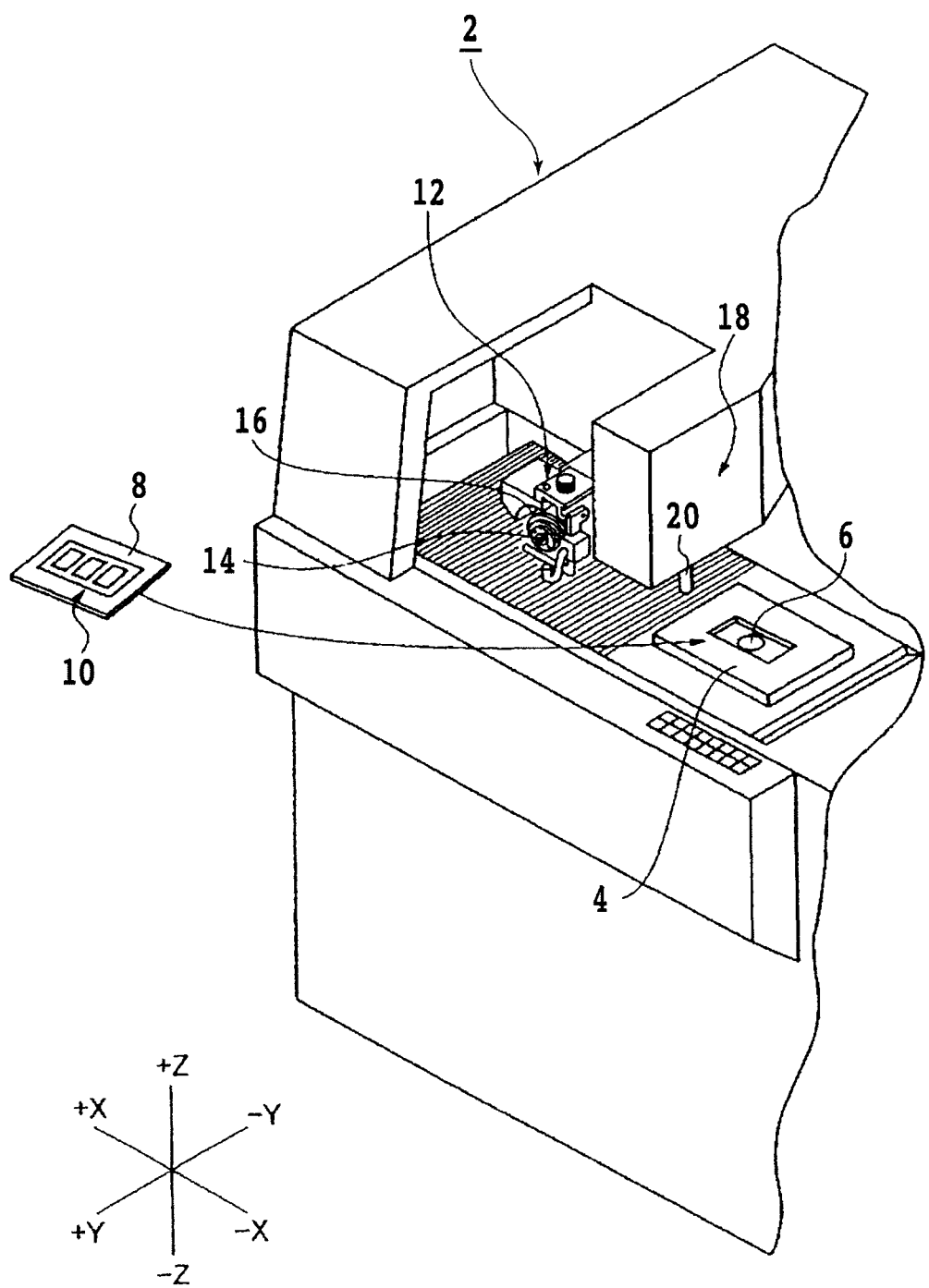
FIG. 1 is a partially broken perspective view showing an example of a cutting apparatus.

An embodiment of the present invention will be described in detail below. Referring to FIG. 1, there is shown a partially broken perspective view of a cutting apparatus 2 suitable for carrying out the cutting method of the present invention. A suction table 4 of the cutting apparatus 2 is formed with a suction part 6 which communicates with a suction source (not shown). The suction table 4 is so arranged that it can be reciprocated in an X-axis direction and can be rotated. A QFN substrate 10, which is a kind of package substrate and is a workpiece here, is placed on a fixing jig (holding jig) 8. The fixing jig 8 with the QFN substrate 10 mounted thereon is placed on the suction table 4 of the cutting apparatus 2. When the fixing jig 8 carrying the QFN substrate 10 thereon is mounted on the suction table 4 and a suction force is applied through the suction part 6, the suction force acts on each of suction holes (not shown) of the fixing jig 8, whereby the QFN substrate 10 is held by suction.

The cutting apparatus 2 is provided with a cutting unit 12 configured by mounting a cutting blade 16 to a tip portion of a spindle 14. Further, alignment means 18 for detecting a predetermined cutting line to be cut of the QFN substrate 10 is so disposed that it can be moved in a Y-axis direction and a Z-axis direction as one body with the cutting unit 12. The QFN substrate 10 suction held on the suction table 4 through the fixing jig 8 is moved in a positive (+) X-axis direction, to be thereby positioned beneath the alignment unit 18, and an alignment is conducted in which a surface of the QFN substrate 10 is imaged by an imaging unit 20 constituting the alignment unit 18 and the predetermined cutting line to be cut is detected.

Figure 2:
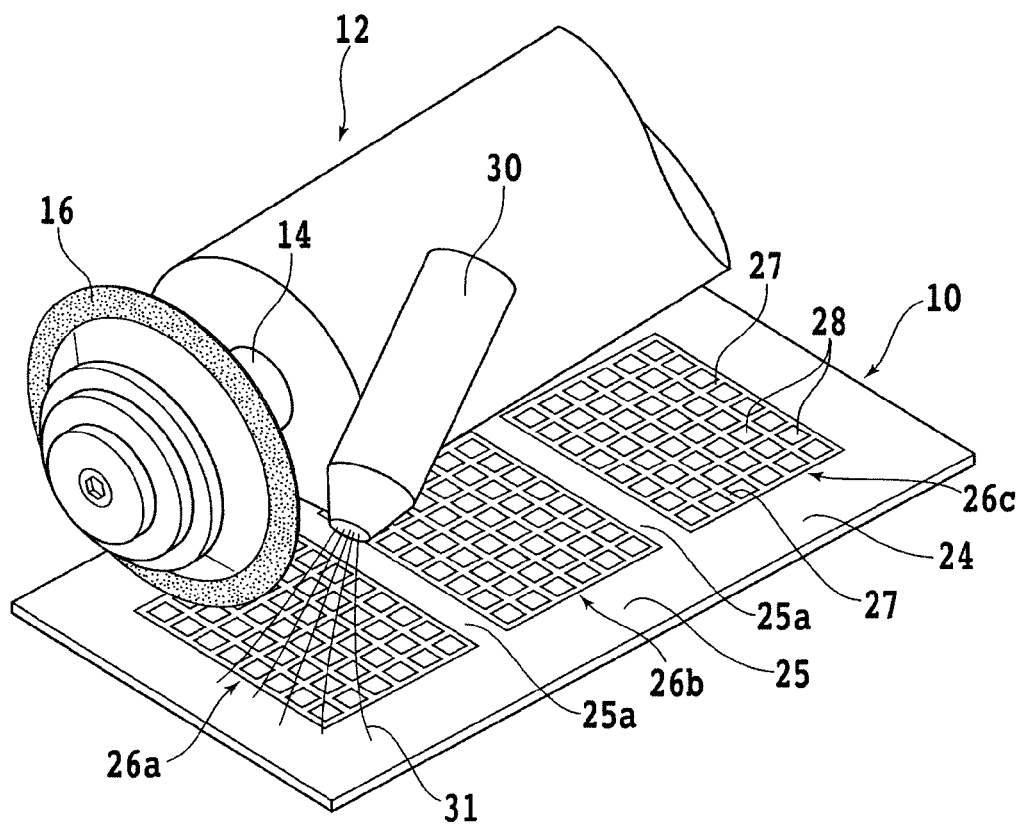
FIG. 2 is a schematic perspective view for explaining a cutting step.

Now, referring to FIG. 2, the cutting method according to this embodiment of the present invention will be described. The QFN substrate 10 as a workpiece has a rectangular metal frame 24. In regions surrounded by a peripheral marginal region 25 and non-device regions 25a of the metal frame 24, there are a plurality of (in the illustrated example, three) device regions 26a, 26b, and 26c. In each of the device regions 26a, 26b, and 26c, a plurality of device forming areas 28 are sectioned by first and second predetermined cutting lines 27a and 27b provided in orthogonally crossing directions, with a plurality of electrodes (not shown) being formed in each of the device forming areas 28.

The electrodes are insulated from one another by a resin molded around the metal frame 24. Upon cutting of the first predetermined cutting lines 27a and the second predetermined cutting lines 27b, the electrodes of the devices appear on both sides of each cutting line. In FIG. 2, symbol 12 denotes a cutting unit of the cutting apparatus 2. The cutting unit 12 includes the cutting blade 16 mounted to the tip portion of the spindle 14, which is rotationally driven by a motor (not shown). Adjacently to the cutting blade 16, there is disposed a cutting fluid supply nozzle 30 for supplying a cutting fluid to a processing point at which the cutting blade 16 cuts into the workpiece.

In the cutting method according to this embodiment, with the QFN substrate 10 suction held by the suction table 4 through the fixing jig 8, and while supplying a cutting fluid 31 from the cutting fluid supply nozzle 30 to the processing point at which the cutting blade 16 cuts into the QFN substrate 10 as the workpiece, the suction table 4 is put to machining feed in the +X direction, so as to cut the first predetermined cutting line 27a of the QFN substrate 10 by the cutting blade 16. The cutting fluid 31 supplied from the cutting fluid supply nozzle 30 contains at least an organic acid and an oxidizing agent. Preferably, the cutting fluid 31 further contains an anticorrosive.

While putting the cutting unit 12 to indexing feed in the Y-axis direction, the first predetermined cutting lines 27a are cut one after another by the cutting blade 16 while supplying the cutting fluid 31 from the cutting fluid supply nozzle 30. Next, the suction table 4 is rotated 90 degrees, and thereafter the second predetermined cutting lines 27b are cut one after another by the cutting blade 16 while supplying the cutting fluid 31 from the cutting fluid supply nozzle 30, so as to divide the QFN substrate 10 into CSPs.

In the cutting method according to this embodiment, the cutting is carried out while supplying the cutting fluid 31 containing at least an organic acid and an oxidizing agent to the processing point at which the cutting blade 16 cuts into the QFN substrate 10. The organic acid contained in the cutting fluid 31 modifies the metal included in the QFN substrate 10, so that the QFN substrate 10 can be cut while suppressing the ductility of the metal. Therefore, burrs (projections) would not be generated from the metal due to the cutting. In addition, the use of the oxidizing agent makes it possible to oxidize the surface of the metal, thereby lowering the ductility of the metal, and to enhance the processability of the metal surface.

As the organic acid, there can be used, for example, a compound that has at least one carboxyl group and at least one amino group in its molecule. In this case, it is preferable that at least one of the amino group(s) is a secondary or tertiary amino group. In addition, the compound used as the organic acid may have a substituent group.

As the organic acid, there can be used amino acids. Examples of the amino acids usable here include glycine, dihydroxyethylglycine, glycylglycine, hydroxyethylglycine, N-methylglycine, β-alanine, L-alanine, L-2-aminobutyric acid, L-norvaline, L-valine, L-leucine, L-norleucine, L-alloisoleucine, L-isoleucine, L-phenylalanine, L-proline, sarcosine, L-ornithine, L-lysine, taurine, L-serine, L-threonine, L-allothreonine, L-homoserine, L-thyroxine, L-tyrosine, 3,5-diiodo-L-tyrosine, β-(3,4-dihydroxyphenyl)-L-alanine, 4-hydroxy-L-proline, L-cysteine, L-methionine, L-ethionine, L-lanthionine, L-cystathionine, L-cystine, L-cystic acid, L-glutamic acid, L-aspartic acid, S-(carboxymethyl)-L-cysteine, 4-aminobutyric acid, L-asparagine, L-glutamine, azaserine, L-canavanine, L-citrulline, L-arginine, δ-hydroxy-L-lysine, creatine, L-kynurenine, L-histidine, 1-methyl-L-histidine, 3-methyl-L-histidine, L-tryptophane, actinomycin C1, ergothioneine, apamin, angiotensin I, angiotensin II, and antipain. Among others, particularly preferred are glycine, L-alanine, L-proline, L-histidine, L-lysine, and dihydroxyethylglycine.

Also, amino polyacids can be used as the organic acid. Examples of the amino polyacids usable here include iminodiacetic acid, nitrilotriacetic acid, diethylenetriaminepentaacetic acid, ethylenediaminetetraacetic acid, hydroxyethyliminodiacetic acid, nitrilotrismethylenephosphonic acid, ethylenediamine-N,N,N',N'-tetramethylenesulfonic acid, 1,2-diaminopropanetetraacetic acid, glycol ether diaminetetraacetic acid, transcyclohexanediaminetetraacetic acid, ethylenediamineorthohydroxyphenylacetic acid, ethylenediaminedisuccinic acid (SS isomer), β-alaninediacetic acid, N-(2-carboxylatoethyl)-L-aspartic acid, and N,N'-bis(2-hydroxybenzyl)ethylenediamine-N,N'-diacetic acid.

Further, carboxylic acids can be used as the organic acid. Examples of the carboxylic acids usable here include saturated carboxylic acids such as formic acid, glycolic acid, propionic acid, acetic acid, butyric acid, valeric acid, hexanoic acid, oxalic acid, malonic acid, glutaric acid, adipic acid, malic acid, succinic acid, pimelic acid, mercaptoacetic acid, glyoxylic acid, chloroacetic acid, pyruvic acid, acetoacetic acid, glutaric acid, etc., unsaturated carboxylic acids such as acrylic acid, methacrylic acid, crotonic acid, fumaric acid, maleic acid, mesaconic acid, citraconic acid, aconitic acid, etc., and cyclic unsaturated carboxylic acids such as benzoic acids, toluic acid, phthalic acids, naphthoic acid, pyromellitic acid, naphthalic acid, etc.

As the oxidizing agent, there can be used, for example, hydrogen peroxide, peroxides, nitrates, iodates, periodates, hypochlorites, chlorites, chlorates, perchlorates, persulfates, dichromates, permanganate, cerates, vanadates, ozonated water, silver(II) salts, iron(III) salts, and their organic complex salts.

Besides, an anticorrosive may be mixed in the cutting fluid 31. Mixing of the anticorrosive makes it possible to prevent corrosion (elution) of the metal included in the QFN substrate 10. As the anticorrosive, there is preferably used a heterocyclic aromatic ring compound which has at least three nitrogen atoms in its molecule and has a fused ring structure or a heterocyclic aromatic ring compound which has at least four nitrogen atoms in its molecule. Further, the aromatic ring compound preferably includes a carboxyl group, sulfo group, hydroxyl group, or alkoxyl group. Specific preferable examples of the aromatic ring compound include tetrazole derivatives, 1,2,3-triazole derivatives, and 1,2,4-triazole derivatives.

Examples of the tetrazole derivatives usable as the anticorrosive include those which do not have a substituent group on the nitrogen atoms forming the tetrazole ring and which have, introduced into the 5-position of the tetrazole, a substituent group selected from the group consisting of sulfo group, amino group, carbamoyl group, carbonamide group, sulfamoyl group, and sulfonamide group, or an alkyl or aryl group substituted with at least one substituent group selected from the group consisting of hydroxyl group, carboxyl group, sulfo group, amino group, carbonamide group, sulfamoyl group, and sulfonamide group.

Examples of the 1,2,3-triazole derivatives usable as the anticorrosive include those which do not have a substituent group on the nitrogen atoms forming the 1,2,3-triazole ring and which have, introduced into the 4-position and/or 5-position of the 1,2,3-triazole, a substituent group selected from the group consisting of hydroxyl group, carboxyl group, sulfo group, amino group, carbamoyl group, carbonamide group, sulfamoyl group, and sulfonamide group, or an alkyl or aryl group substituted with at least one substituent group selected from the group consisting of hydroxyl group, carboxyl group, sulfo group, amino group, carbamoyl group, carbonamide group, sulfamoyl group, and sulfonamide group.

Besides, examples of the 1,2,4-triazole derivatives usable as the anticorrosive include those which do not have a substituent group on the nitrogen atoms forming the 1,2,4-triazole ring and which have, introduced into the 2-position and/or 5-position of 1,2,4-triazole, a substituent group selected from the group consisting of sulfo group, carbamoyl group, carbonamide group, sulfamoyl group, and sulfonamide group, or an alkyl or aryl group substituted with at least one substituent group selected from the group consisting of hydroxyl group, carboxyl group, sulfo group, amino group, carbamoyl group, carbonamide group, sulfamoyl group, and sulfonamide group.

While an example in which the cutting method of the present invention is applied to the QFN substrate 10 has been described in the above embodiment, the workpiece is not limited to this one. The cutting method of the present invention can also be applied to wafers in which test element group (TEG) is formed on predetermined division lines, and workpieces composed only of metal, such as metal plates.

Figure 3:
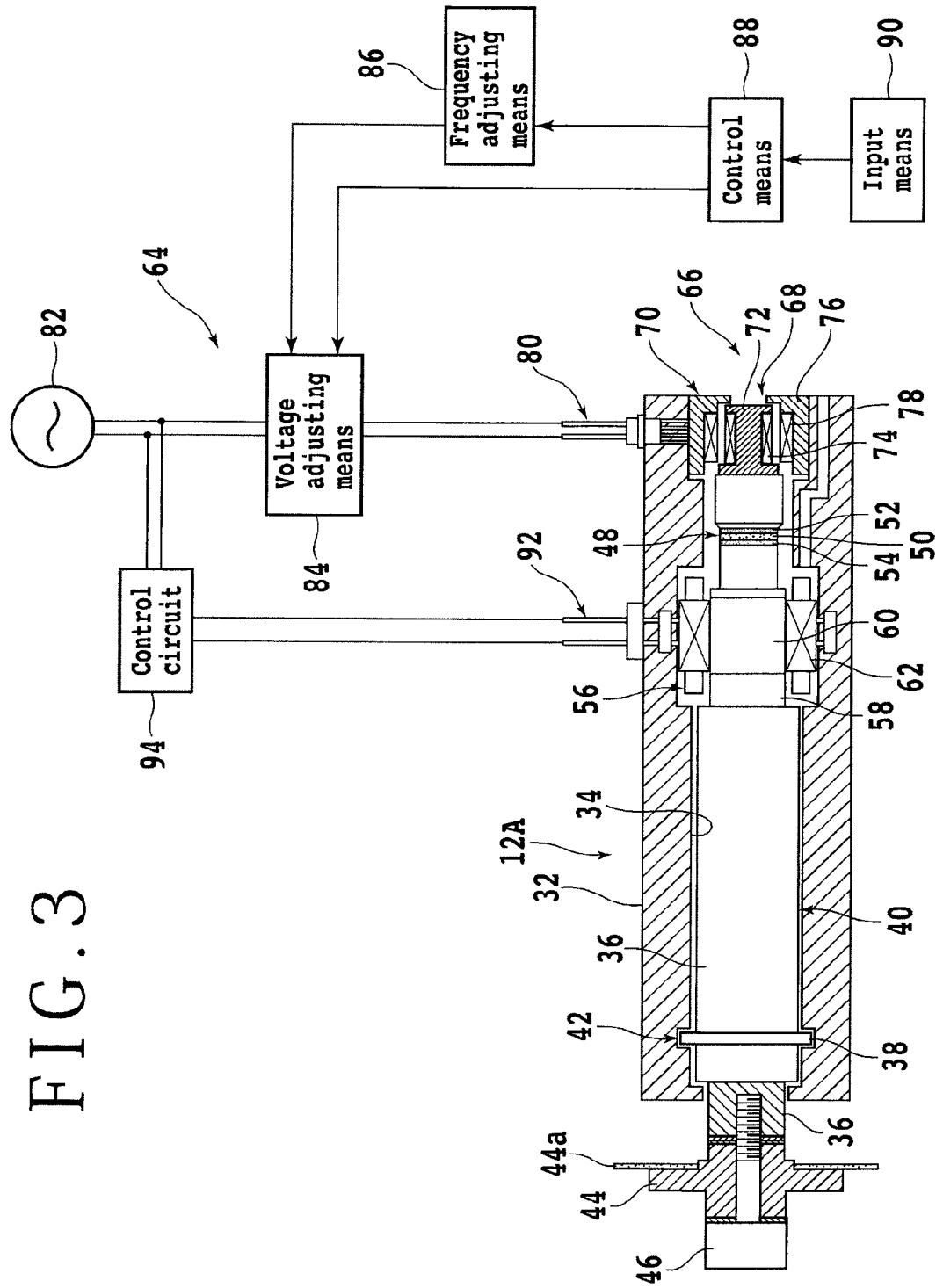
FIG. 3 is a sectional view of a cutting unit capable of applying an ultrasonic vibration.

In carrying out the cutting method of the present invention, it is preferable, depending on the kind of the workpiece, to conduct the cutting while supplying the cutting fluid 31 from the cutting fluid supply nozzle 30 and applying an ultrasonic vibration to the cutting blade 16 in a radial direction of the cutting blade 16. A sectional figure of a cutting unit capable of applying an ultrasonic vibration to a cutting blade is shown in FIG. 3. A spindle housing 32 of a cutting unit 12A is provided therein with a bore 34, in which a spindle 36 is housed in a rotatable manner.

The spindle 36 is equipped with an ultrasonic transducer 48 for applying an ultrasonic vibration to a cutting blade 44. The ultrasonic transducer 48 includes an annular piezoelectric element 50 polarized in the axial direction of the spindle 36, and annular electrode plates 52 and 54 mounted to polarized surfaces on both sides of the piezoelectric element 50. The piezoelectric element 50 is composed of a piezoelectric ceramic such as barium titanate, lead zirconate titanate, and lithium tantalate. When an AC power at a predetermined frequency is applied to the annular electrode plates 52 and 54 by power supplying means (described later), the ultrasonic transducer 48 configured as above generates an ultrasonic vibration on the spindle 36. Incidentally, a plurality of such ultrasonic transducers 48 may be arranged in the axial direction of the spindle 36.

The cutting unit 12A includes an electric motor 56 for rotationally driving the spindle 36. The electric motor 56 is constituted, for example, of a permanent magnet type motor. The electric motor 56 includes a rotor 60 composed of permanent magnet mounted to a motor mounting part 58 formed at an intermediate portion of the spindle 36, and a stator coil 62 disposed on a spindle housing 32 on the outer circumference side of the rotor 60. When an AC power is impressed on the stator coil 62 of the thus configured electric motor 56 by the power supplying means (described later), the rotor 60 is rotated, whereby the spindle 36 with the rotor 60 mounted thereto is rotated.

The cutting unit 12A further includes power supplying means 64 adapted to supply an AC power to the ultrasonic transducer 48 and apply an AC power to the electric motor 56. The power supplying means 64 includes a rotary transformer 66 disposed at one end (right end) of the spindle 36. The rotary transformer 66 has power-receiving means 68 disposed at the right end of the spindle 36, and power-feeding means 70 disposed facing the power-receiving means 68. The power-receiving means 68 includes a rotary core 72 mounted to the spindle 36, and a receiving coil 74 wound around the rotary core 72.

To one end of the receiving coil 74 of the power-receiving means 68 configured as above, the electrode plate 52 of the piezoelectric element 50 is connected via a lead wire. To the other end of the receiving coil 74, the electrode plate 54 of the piezoelectric element 50 is connected through a lead wire. The power-feeding means 70 includes a stator core 76 disposed on the outer circumference side of the power-receiving means 68, and a feeding coil 78 disposed on the stator core 76. The feeding coil 78 of the power-feeding means 70 configured in this fashion is supplied with an AC power by way of an electric wiring 80.

The power supplying means 64 includes: an AC power supply 82; voltage adjusting means 84 interposed between the AC power supply 82 and the receiving coil 78 of the rotary transformer 66; frequency adjusting means 86 for adjusting the frequency of the AC power supplied to the power-feeding means 70; control means 88 for controlling the voltage adjusting means 84 and the frequency adjusting means 86; and input means 90 through which such factors as the frequency of the ultrasonic vibration applied to the cutting blade 44 are inputted to the control means 88.

The AC power supply 82 supplies an AC power to the stator coil 62 of the electric motor 56 through a control circuit 94 and an electric wiring 92. As the frequency adjusting means 86, there can be used a digital function generator having a product code "DF-1905" available from NF Corporation. By use of DF-1905, it is possible to adjust the frequency appropriately within the range from 10 Hz to 500 kHz.

Now, operation of the cutting unit 12A will be described below. An AC power is supplied from the power supplying means 64 to the stator col 62 of the electric motor 56. As a result, the electric motor 56 is rotated to rotate the spindle 36, whereby the cutting blade 44 attached to the tip portion of the spindle 36 is rotated. Symbol 44a denotes a cutting edge of the cutting blade 44. On the other hand, the power supplying means 64 controls the voltage adjusting means 84 and the frequency adjusting means 86 through the control means 88, to control the AC power to a predetermined voltage and adjust the frequency of the AC power to a predetermined frequency, thereby supplying an AC power of the predetermined frequency to the feeding coil 78 of the power-feeding means 70 constituting the rotary transformer 66.

When the AC power of the predetermined frequency is thus supplied to the feeding coil 78, an AC power of a predetermined frequency is impressed between the electrode plate 52 and the electrode plate 54 of the ultrasonic transducer 48 via the receiving coil 74 of the power-receiving means 68 being rotated. As a result, the ultrasonic transducer 48 is repeatedly displaced in a radial direction, generating an ultrasonic vibration. The ultrasonic vibration is transmitted through the spindle 36 to the cutting blade 44, putting the cutting blade 44 into ultrasonic vibration in a radial direction.

In the cutting method according to this embodiment, the cutting of the workpiece is conducted while supplying the cutting fluid 31 from the cutting fluid supply nozzle 30 and while applying the ultrasonic vibration to the cutting blade 44 (being rotated at high speed) in the radial direction of the cutting blade 44. When a hard brittle material such as sapphire, silicon carbide (SiC), glass, etc. provided thereon with a metallic film is cut by a cutting blade, chipping would occur at the cutting surface. When such a workpiece is cut while applying an ultrasonic vibration to the cutting blade, however, the chipping at the cutting surface can be restrained. Furthermore, by cutting a workpiece while supplying the cutting fluid 31, it is possible to restrain generation of burrs.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A cutting method for cutting by a cutting blade a workpiece which includes metal at least in a predetermined cutting position, the cutting method comprising:
   a cutting step of cutting by the cutting blade the predetermined cutting position of the workpiece while supplying a cutting fluid to a processing point at which the cutting blade cuts into the workpiece, the cutting fluid containing an organic acid and an oxidizing agent,
   wherein the cutting fluid reduces ductility of the metal.

2. The cutting method according to claim 1, wherein the cutting fluid further contains an anticorrosive.

3. The cutting method according to claim 1, wherein the cutting step is carried out with an ultrasonic vibration applied to the cutting blade in a radial direction of the cutting blade.

\* \* \* \* \*